(12) United States Patent
Van Buskirk et al.

(10) Patent No.: US 6,501,681 B1
(45) Date of Patent: Dec. 31, 2002

(54) USING A LOW DRAIN BIAS DURING ERASE VERIFY TO ENSURE COMPLETE REMOVAL OF RESIDUAL CHARGE IN THE NITRIDE IN SONOS NON-VOLATILE MEMORIES

(75) Inventors: Michael Van Buskirk, Saratoga; Narbeh Derhacobian, Belmont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/684,694

(22) Filed: Oct. 4, 2000

Related U.S. Application Data

(60) Provisional application No. 60/225,239, filed on Aug. 15, 2000.

(51) Int. Cl.[7] ............................................. G11C 16/06
(52) U.S. Cl. ......................... 365/185.22; 365/185.03; 365/185.26; 365/185.29; 365/185.3
(58) Field of Search ....................... 365/185.22, 185.03, 365/185.26, 185.29, 185.3

(56) References Cited

U.S. PATENT DOCUMENTS

| | | | | |
|---|---|---|---|---|
| 5,610,430 A | * | 3/1997 | Yamashita et al. | 257/412 |
| 5,847,994 A | * | 12/1998 | Motoshima et al. | 365/185.11 |
| 6,130,841 A | * | 10/2000 | Tanaka et al. | 365/185.221 |
| 6,134,145 A | * | 10/2000 | Wong | 365/185.22 |
| 6,205,056 B1 | * | 3/2001 | Pan et al. | 365/185.2 |
| 6,218,695 B1 | * | 4/2001 | Nachumovsky | 257/296 |
| 6,252,803 B1 | * | 6/2001 | Fastow et al. | 365/185.22 |
| 6,330,192 B1 | * | 12/2001 | Ohba et al. | 365/185.3 |

* cited by examiner

*Primary Examiner*—David Nelms
*Assistant Examiner*—Connie C. Yoha
(74) *Attorney, Agent, or Firm*—Fliesler, Dubb, Meyer & Lovejoy LLP

(57) ABSTRACT

An erase-verify operation is performed on a nonvolatile memory cell with an oxide-nitride-oxide structure by using a low drain bias voltage to allow residual charge remaining in the nitride layer after a typical erase operation to be detected effectively with a high degree of sensitivity.

31 Claims, 5 Drawing Sheets

USING A LOW DRAIN BIAS DURING ERASE VERIFY TO ENSURE COMPLETE REMOVAL OF RESIDUAL CHARGE IN THE NITRIDE IN SONOS NON-VOLATILE MEMORIES

CROSS-REFERENCE TO PROVISIONAL APPLICATION

This Patent Application claims the benefit of Provisional Application No. 60/225,239 filed Aug. 15, 2000.

TECHNICAL FIELD

The present invention relates to a non-volatile memory, and more particularly, to a method of performing an erase-verify operation on a non-volatile memory cell with an oxide-nitride-oxide (ONO) structure.

BACKGROUND

Non-volatile memory devices have been developed by the semiconductor integrated circuit industry for various applications such as computers and digital communications. A variety of non-volatile memory devices with oxide-nitride-oxide (ONO) structures have been developed. An example of a typical non-volatile memory cell with an ONO structure comprises a semiconductor substrate with source and drain regions, a channel region which is formed close to the surface of the semiconductor substrate between the source and the drain when electrical conduction occurs between the source and the drain, an oxide-nitride-oxide (ONO) film on top of the substrate surface between the source and the drain, and a gate on top of the ONO film. The ONO film comprises three layers including a first oxide layer on top of the substrate surface between the source and the drain, a nitride layer on top of the first oxide layer, and a second oxide layer on top of the nitride layer. The nitride layer in the ONO film is capable of trapping electrons which are generated in the channel region of the semiconductor substrate during a programming operation.

The conventional non-volatile memory cell with a typical ONO structure is programmed by generating hot electrons in the vicinity of the drain region in the substrate and injecting the hot electrons into the ONO film. More specifically, the hot electrons are trapped in a portion of the nitride layer close to the drain of the non-volatile memory cell. Because the nitride layer is an insulator, the hot electrons tend to remain in the portion of the nitride layer close to the drain without dispersing into other portions such as the center of the nitride layer.

The presence of the trapped hot electrons in the portion of the nitride layer adjacent the drain signifies that at least the drain side of the non-volatile memory cell is "programmed". The non-volatile memory cell with a typical ONO structure may be programmed by applying high positive voltages to the gate and the drain and grounding the source of the non-volatile memory cell to inject hot electrons into the portion of the nitride layer adjacent the drain. This technique is also called channel hot electron programming.

FIG. 1 shows a cross-sectional view of a non-volatile memory cell 2 which comprises a substrate 4, an oxide-nitride-oxide (ONO) film 6 comprising a first oxide layer 8 on top of the substrate 4, a nitride layer 10 of top of the first oxide layer 8, and a second oxide layer 12 on top of the nitride layer 10. A polysilicon gate 14 is provided on top of the second outside layer 12. Portions of the substrate 4 are doped with a group V element, such as arsenic, to form a source region 16 and a drain region 18. The source and drain regions 16 and 18 may be produced by implanting arsenic into the substrate 4 to a depth in the range of about 300 Å to about 600 Å. The ONO film 6 is positioned on top of a surface portion 20 of the substrate 4 between the source 16 and the drain 18.

The first oxide layer 8, which is also called a tunnel oxide layer, is positioned directly on top of the surface portion 20 of the substrate 4 between the source 16 and the drain 18. When conduction occurs between the source 16 and the drain 18, a channel is formed in the substrate 4 close to the surface 20 between the source 16 and the drain 18. The first oxide layer 8 may have a thickness on the order of about 75 Å.

The nitride layer 10, which is positioned on top of the first nitride layer 8, is capable of trapping hot electrons which are generated in the channel and injected into a portion 34 of the nitride layer 10 close to the drain region 18 during a typical programming operation. The nitride layer 10 may have a thickness on the order of about 75 Å. The second oxide layer 12, which is positioned on top of the nitride layer 10, has a thickness typically on the order of about 100 Å. The gate 14, which is positioned on top of the second oxide layer 12, may be a conventional polysilicon gate which serves as a control gate for the non-volatile memory cell. The ONO film 6, which comprises the first oxide layer 8, the second oxide layer 12 and the nitride layer 10 sandwiched between the first and second oxide layers 8 and 12, may be fabricated by using conventional techniques known to a person skilled in the art.

FIG. 1 further shows portions of cross-sectional views of additional memory cells 22 and 24 adjacent the memory cell 2 in a non-volatile memory array. The nonvolatile memory cells 22 and 24 each have a device structure identical to the non-volatile memory cell 2 described above. Furthermore, two adjacent nonvolatile memory cells share a common arsenic-doped region which serves both as the drain for one of the cells and as the source for the other cell. For example, the arsenic-doped region 16, which serves as the source for the non-volatile memory cell 2, also serves as the drain for the non-volatile memory cell 22. Similarly, the arsenic-doped region 18, which serves as the drain for the non-volatile memory cell 2, also serves as the source for the non-volatile memory cell 24.

FIG. 1 shows a typical electron charge distribution in the substrate 4 after a typical programming operation in which channel hot electrons are generated in the substrate 4 and then trapped in the nitride layer 10. Such a programming operation is also called channel hot electron programming. After the non-volatile memory cell 2 is programmed, negative charge is formed in the portion of the substrate 4 beneath the substrate surface 20 between the source 16 and the drain 18. Electrons are trapped in this substrate region during the channel hot electron programming operation with an electron charge distribution in dependence upon the gate and drain voltages applied to the non-volatile memory cell 2 during the programming operation and the doping profiles for the source region 16 and the drain region 18.

More specifically, FIG. 1 shows an example of a typical electron charge distribution 26 in the portion of the substrate 4 between the source 16 and the drain 18 of the non-volatile memory cell 2 in which both the drain side and the source side are programmed. The negative charge in the substrate 4 is relatively concentrated in a first region 28 adjacent the source 16 and in a second region 30 adjacent the drain 18 after a typical channel hot electron programming operation. Furthermore, hot electrons are injected into the nitride layer 10 of the ONO film 6 during the programming operation.

Since the nitride layer 10 is an insulation layer, hot electrons which are trapped in the nitride layer 10 tend to remain localized within certain regions of the nitride layer 10 without spreading or dispersing into other regions of the nitride layer 10. In the example shown in FIG. 1 in which both the drain side and the source side are programmed, hot electrons 32 are trapped in a first portion 34 of the nitride layer 10 adjacent the drain 18 and a second portion 36 of the nitride layer 10 adjacent the source 16. Furthermore, as shown in FIG. 1, the center of the nitride layer 10 tends to be free of hot electrons, and the electron charge distribution in the substrate 4 tends to be minimal in the center region between the source 16 and the drain 18.

Depending upon the manner in which the nonvolatile memory cell 2 is programmed, electron charge distributions in the substrate 4 and the nitride layer 10 may be different from those shown in FIG. 1. For example, if only the drain side of the non-volatile memory cell 2 is programmed with hot electrons, only the portion 34 of the nitride layer 10 adjacent the drain 18 has a concentration of trapped hot electrons after the programming operation. Instead of the electron charge distribution 26 in the substrate 4 as shown in FIG. 1, the electrons in the substrate 4 would be concentrated in the substrate region 30 closer to the drain 18 beneath the portion 34 of the nitride layer 10 in which the hot electrons were trapped during the programming operation.

After the non-volatile memory cell is programmed, a conventional reading operation may be performed on the non-volatile memory cell by applying positive voltages to the drain and the gate and grounding the source of the non-volatile memory cell. For a conventional non-volatile memory cell with a typical ONO structure, the gate and drain voltages for the reading operation are respectively less than the typical gate and drain voltages for the channel hot electron programming operation. However, a sufficiently high drain voltage is typically applied to the drain of the non-volatile memory cell during the reading operation to cause deep saturation of charge in a region of the substrate adjacent the drain region and beneath the portion of the nitride layer in which the hot electrons accumulated during the programming operation. For example, a high drain voltage of at least 1.6 V is typically applied to the drain of a typical ONO-based non-volatile memory cell during the reading operation to achieve deep saturation of charge in the substrate region beneath the portion of the nitride layer in which the hot electrons were trapped during the programming operation.

FIG. 2 shows typical charge distributions during a typical reading operation in which the trapped hot electrons 32 in the portion 34 of the nitride layer 10 adjacent the drain region 18 are sensed after the drain side of the non-volatile memory cell 2 is programmed. In a typical reading operation, a high drain bias voltage is applied to the drain 18 of the non-volatile memory cell 2 such that electrons are deeply saturated in the region 50 of the substrate 4 adjacent the drain 18. The extent of the charge distribution in the substrate 4 during the conventional reading operation is such that the negative charge region 50 covers the portion 52 of the substrate surface 20 beneath the portion 34 of the nitride layer 10 in which the hot electrons 32 were trapped after the channel hot electron programming operation. Deep saturation of charge occurs in the substrate region 50 when the positive drain bias voltage $V_D$ is sufficiently high, such that the threshold voltage $V_T$ for allowing conduction between the drain 18 and the source 16 is no longer a sensitive function of the drain voltage $V_D$.

A conventional reading operation is typically performed by applying a high drain voltage $V_D$ to achieve deep saturation of charge in the region 50 of the substrate 4 adjacent the drain 18 and grounding the source 16. A positive gate voltage $V_G$ is typically applied to the gate 14 of the non-volatile memory cell 2 during the conventional reading operation. Since a sufficiently large number of hot electrons 32 are trapped in the portion 34 of the nitride layer 10 adjacent the drain region 18 after a typical channel hot electron programming operation, the presence of the hot electrons 32 in the portion 34 of the nitride layer 10 can be detected without a high degree of sensitivity.

A high drain bias voltage $v_D$ applied to the drain 18 of the non-volatile memory cell 2 produces deep saturation of charge in the region 50 of the substrate 4 such that the saturated charge beneath the portion 52 of the substrate surface 20 is able to "cover" the hot electrons 32 trapped in the portion 34 of the nitride layer 10 during the conventional reading operation. With a sufficiently high drain bias voltage $V_D$, the threshold voltage $V_T$ does not vary greatly with respect to the drain voltage $V_D$. In a typical reading operation, the high drain bias voltage $V_D$ applied to the drain 18 of the non-volatile memory cell 2 to produce deep saturation of charge in the substrate region 50 adjacent the drain 18 is typically greater than 1.6 V with a gate voltage $V_G$ of about 3.3 V applied to the gate 14 of the non-volatile memory cell 2.

After the non-volatile memory cell is programmed, it can be erased by using a conventional technique of drain side hot hole injection. Although drain side hot hole injection supposedly removes the hot electrons trapped in the portion of the nitride layer adjacent the drain region after the programming operation, some residual electrons remain in the portion of the nitride layer adjacent the drain region after the erase operation which uses the conventional drain side hot hole injection technique. A problem associated with the conventional drain side hot hole injection technique is that it results in an "incomplete erase" after each erase operation. Because a residual amount of negative charge remains in the portion of the nitride layer adjacent the drain region and is not completely removed after each erase operation, the residual charge accumulates in the portion of the nitride layer adjacent the drain region after a few hundred or thousand program-erase cycles.

FIG. 3 shows typical charge distributions in the substrate 4 and in the nitride layer 10 of the ONO film 6 after a typical erase operation. More specifically, FIG. 3 shows an example of charge distributions in the non-volatile memory cell 2 in which both the drain side and the source side are erased with the injection of hot holes during the erase operation. As shown in FIG. 3, most of the hot electrons in the portion 38 of the nitride layer 10 adjacent the drain 18 and in the portion 36 of the nitride layer 10 adjacent the source 16 are removed by the erase operation.

However, some residual electrons 38 remain in the portions 34 and 36 of the nitride layer after a conventional erase operation which results in an "incomplete erase" of the non-volatile memory cell. Because the nitride layer is an insulator, the residual charge 34 tends to remain localized in the portions 34 and 36 of the nitride layer 10 without dispersing into the center of the nitride layer 10. The center of the nitride layer 10 tends to be free of residual charge after the conventional erase operation. The hole charge distribution between the source 16 and the drain 18 in the substrate 4 tends to be minimal near the center of the substrate portion between the source 16 and the drain 18.

A problem associated with a conventional erase operation is that some electrons remain in a center portion 46 of the substrate 4 between the source 16 and the drain 18 beneath the tunnel oxide layer 8 after each program-erase cycle. Because of the problem of "incomplete erase" resulting from conventional erase operations, the residual negative charge in the center region 14 of the substrate 4 beneath the tunnel oxide layer 8 accumulates and grows in magnitude after a number of repeated program-erase cycles.

Depending upon the gate, source and drain voltages applied to the non-volatile memory cell 2 and the doping profiles of the source 16 and the drain 18, charge distributions other than those shown in FIG. 3 in the substrate 4 and the nitride layer 10 of the ONO film are also possible. For example, if only the drain side of the non-volatile memory cell 2 is erased with hot hole injection, only the portion 34 of the nitride layer 10 adjacent the drain 18 has a concentration of residual charge 38 after the erase operation. Furthermore, the positive charge in the substrate 4 tends to be concentrated in the region 44 of the substrate 4 adjacent the drain 18 and beneath the portion 34 of the nitride layer 10 in which the residual charge 38 remains after the erase operation.

The growing magnitude of the negative charge in the center portion 46 of the substrate 4 below the tunnel oxide layer 8 causes the threshold voltage $V_T$ for allowing conduction between the source and the drain to shift progressively positive as the number of program-erase cycles increases. The shifting of the threshold voltage $V_T$ is an undesirable feature in a non-volatile memory cell because different gate voltages would be required for erase operations depending upon the number of program-erase cycles already performed on the non-volatile memory cell.

After each erase operation, an erase-verify operation is usually performed on the non-volatile memory cell to ensure that the bit stored in the non-volatile memory cell has been erased. Erase-verify operations have been traditionally performed in the same manner as conventional reading operations. For example, as in a conventional reading operation, a high drain bias voltage is applied to the drain of the non-volatile memory cell in a conventional erase-verify operation after each program-erase cycle. The source of the non-volatile memory cell is grounded during the conventional erase-verify operation.

A disadvantage of the conventional erase-verify operation is that the high drain bias voltage applied to the drain of the non-volatile memory cell prevents the small amount of residual negative charge remaining in the portion of the nitride layer adjacent the drain after each program-erase cycle from being sensed effectively. Whereas a conventional reading operation after each programming operation can be performed with a high drain bias voltage without the need to be highly sensitive to the negative charge produced by a large number of hot electrons generated in the channel and trapped in the portion of the nitride layer adjacent the drain during the programming operation, there is a need for detecting the residual charge left over in the portion of the nitride layer adjacent the drain after each conventional erase operation with greater sensitivity.

SUMMARY OF THE INVENTION

The present invention satisfies this need. In accordance with the present invention, a method of performing an erase-verify operation on a non-volatile memory cell, which is applied a high drain voltage during a conventional reading operation, comprises the step applying a low drain voltage less than the high drain voltage to the drain of the non-volatile memory cell. In an embodiment in which the high drain voltage applied to the drain of the non-volatile memory cell during a conventional reading operation is at least 1.6 V, the low drain voltage during the erase-verify operation according to the present invention is in the range of about 0.25 V to about 1.5 V. In a further embodiment, the low drain voltage is on the order of about 0.5 V.

During the erase-verify operation with a low drain bias voltage according to the present invention, a positive gate voltage is applied to the gate of the non-volatile memory cell in dependence upon the threshold voltage $V_T$ to turn on the non-volatile memory cell, that is, to allow conduction between the source and the drain. In an embodiment, the gate voltage for the erase-verify operation according to the present invention is approximately equal to the gate voltage applied to the gate of the non-volatile memory cell during the conventional reading operation.

In an embodiment, the gate voltage applied to the gate of the non-volatile memory cell during the erase-verify operation according to the present invention is in the range of about 2 V to about 5 V. In a further embodiment, the gate voltage applied to the gate of the non-volatile memory cell during the erase-verify operation according to the present invention is on the order of about 3.3 V. The source of the non-volatile memory cell is grounded during the erase-verify operation according to the present invention.

Advantageously, the method of performing the erase-verify operation using a low drain bias voltage according to the present invention allows the residual charge remaining in the portion of the nitride layer adjacent the drain after a conventional erase operation to be sensed more effectively. Because the presence of the residual charge in the portion of the nitride layer adjacent the drain after each erase cycle is a sensitive function of drain voltage during the subsequent erase-verify operation, a low drain bias voltage allows the presence of the residual charge to be detected with greater sensitivity during the erase-verify operation according to the present invention.

BRIEF DESCRIPTION OF THE DRAWINGS

The present invention will be described with respect to particular embodiments thereof, and references will be made to the drawings in which.

DETAILED DESCRIPTION

Figure 4:
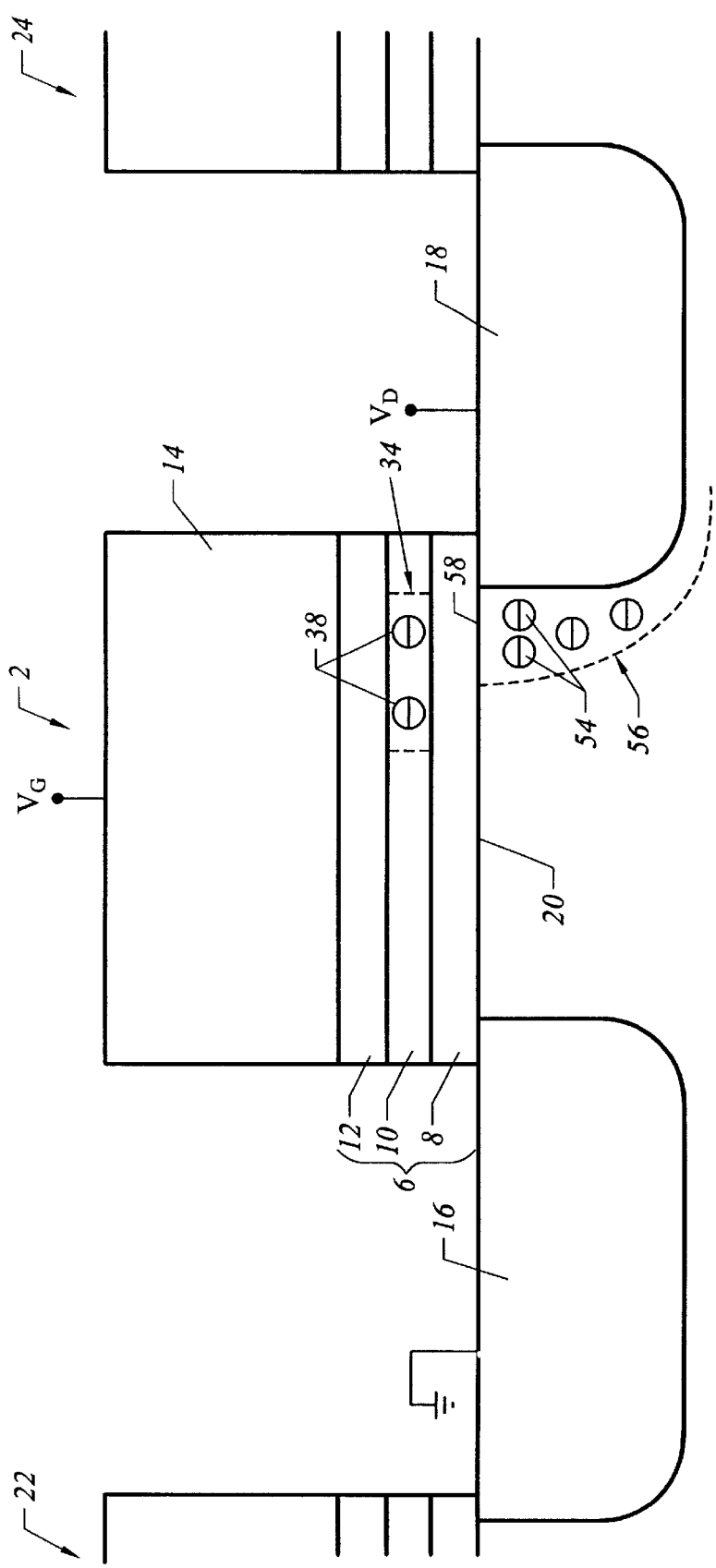
FIG. 4 is a cross-sectional view of the non-volatile memory cell of FIG. 1 in an erase-verify operation with a low drain bias voltage according to the present invention, illustrating less than deep saturation of charge in the portion of the substrate adjacent the drain region and beneath the portion of the nitride layer in which the residual charge remains after the erase operation.

The present invention provides a method of performing an erase-verify operation with a low drain bias voltage to allow the residual charge remaining in the nitride layer 10 to be detected with greater sensitivity after a conventional incomplete erase operation. FIG. 4 shows a typical charge distribution with less than deep saturation of charge in the substrate 4 resulting from the application of a relatively low drain bias voltage $V_D$ to the drain 18 of the non-volatile memory cell 2 during the erase-verify operation according to the present invention. The residual charge 38 remaining in the portion 34 of the nitride layer 10 adjacent the drain 18 after a conventional erase operation is less than the amount of charge which were injected into and trapped in the same portion 34 of the nitride layer 10 adjacent the drain 18 after a conventional channel hot electron programming operation.

Figure 1:
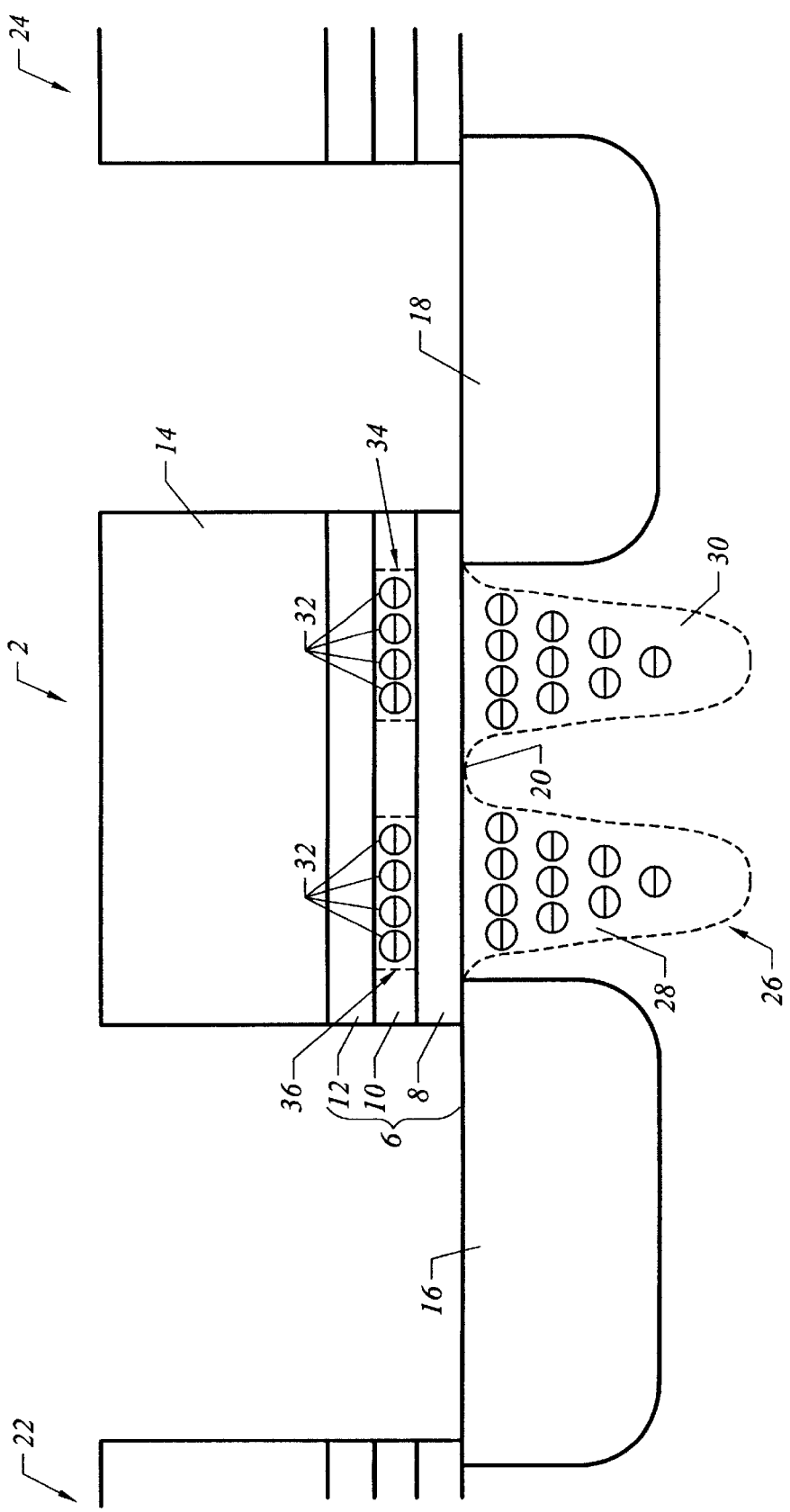
FIG. 1, described above, is a cross-sectional view of a non-volatile memory cell with an oxide-nitride-oxide (ONO) structure illustrating a typical electron charge distribution in the substrate and the presence of hot electrons trapped in portions of the nitride layer adjacent the drain and source regions after a typical programming operation.
Figure 2:
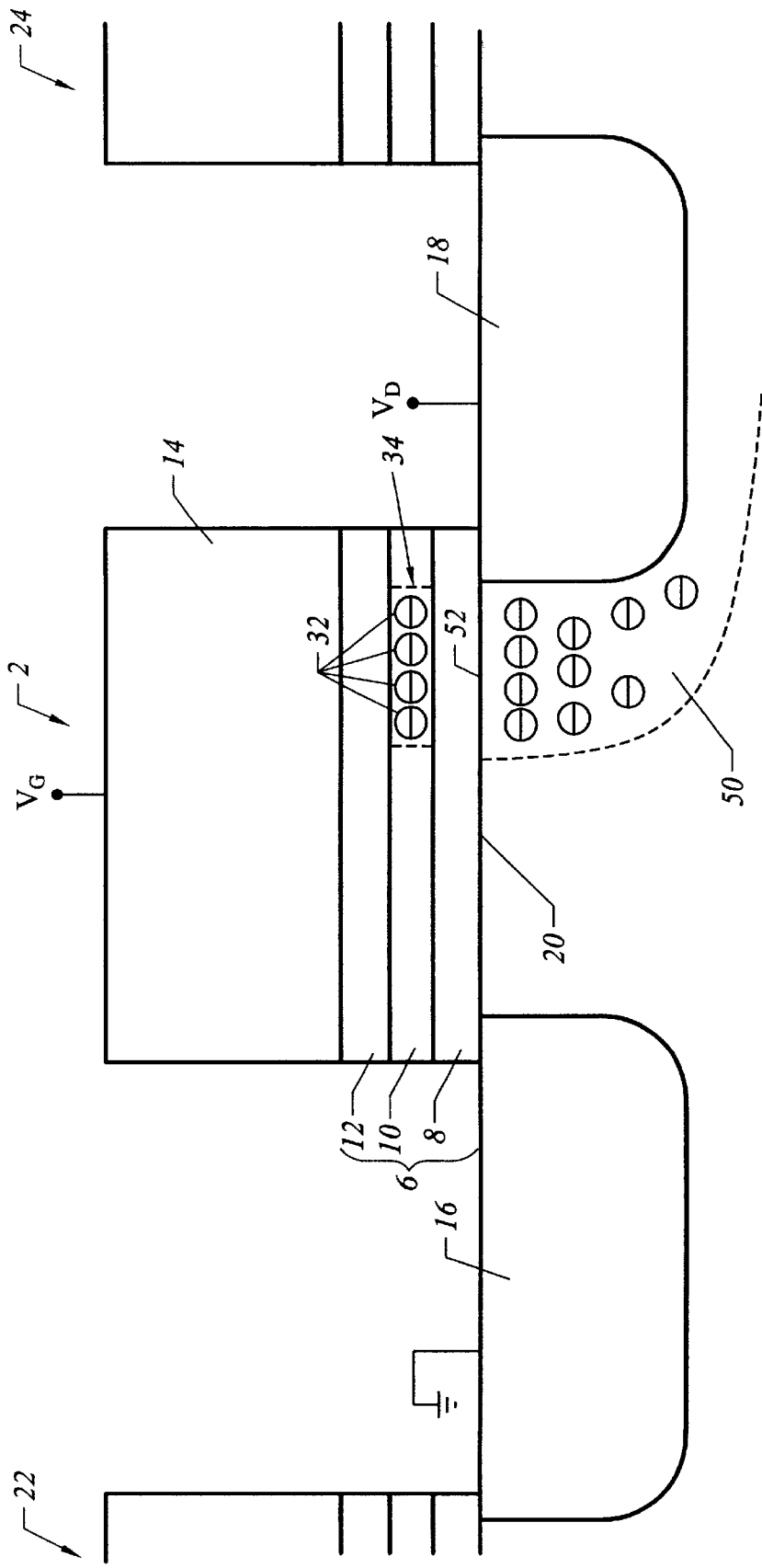
FIG. 2, described above, is a cross-sectional view of the non-volatile memory cell of FIG. 1 during a typical reading operation, illustrating deep charge saturation in the portion of the substrate adjacent the drain region and beneath the portion of the nitride layer in which the hot electrons are trapped after the programming operation.
Figure 3:
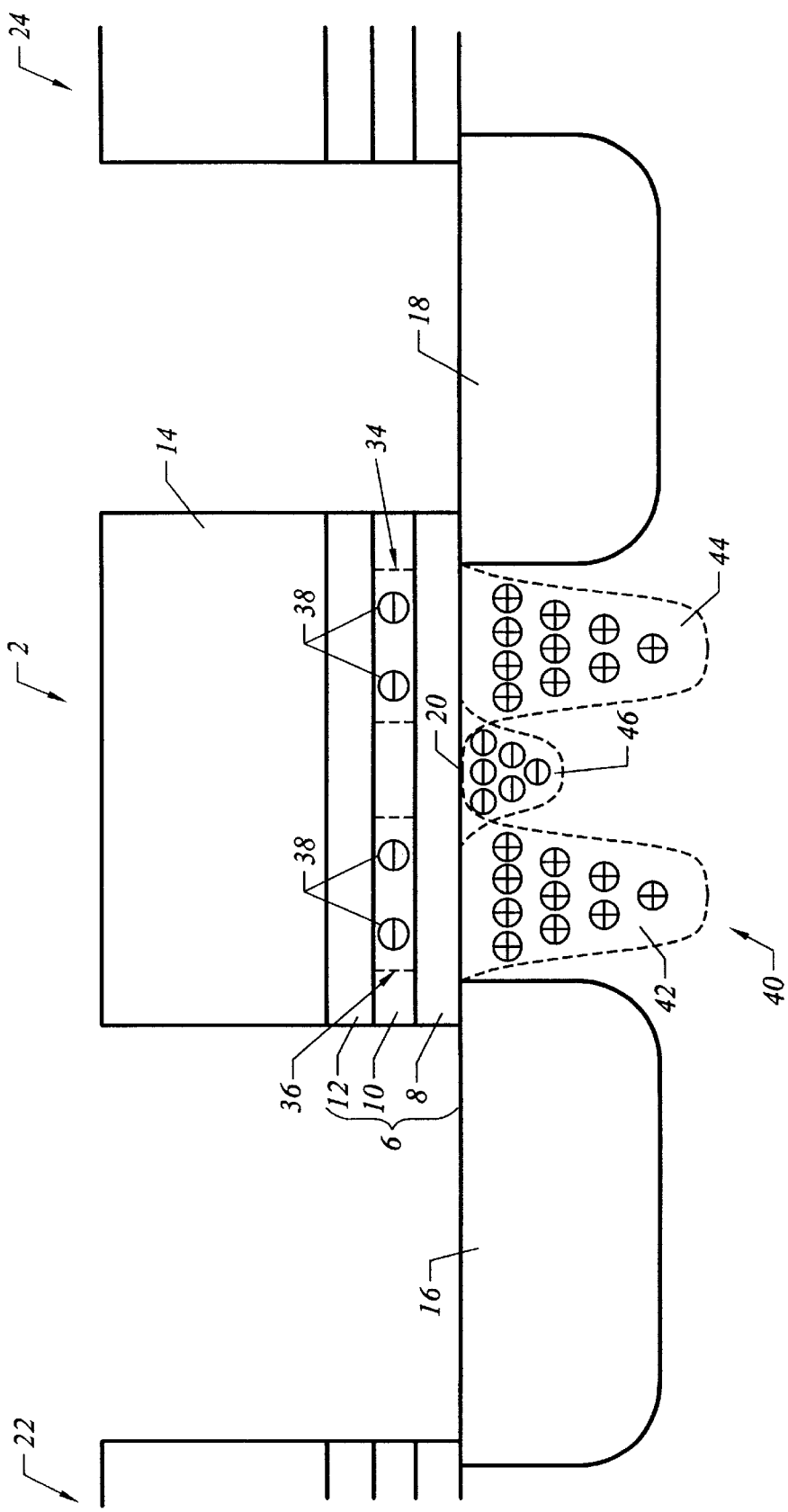
FIG. 3, described above, is a cross-sectional view of the non-volatile memory cell of FIG. 1 illustrating typical charge distributions in the substrate and the presence of residual charge in the portions of the nitride layer adjacent the drain and source regions after a typical erase operation.

When a relatively low drain bias voltage $V_D$ is applied to the drain 18 of the non-volatile memory cell 2 during the erase-verify operation according to the present invention, negative charge 54 is produced in a region 56 of the substrate 4 close to the drain region 18. Compared to the region 50 of the substrate 4 which extends across the portion 52 of the substrate surface 20 beneath the portion 34 of the nitride layer 10 in which hot electrons were trapped in a conventional reading operation as shown in FIG. 2, the region 56 of the substrate 4 in which the negative charge 54 accumulates during the low-drain voltage erase-verify operation according to the present invention as shown in FIG. 4 extends across a smaller portion 58 of the substrate surface 20 adjacent to the drain 18.

When the drain bias voltage $V_D$ is sufficiently low, the region 56 of the substrate 4 adjacent the drain region 18 is not deeply saturated. Some of the negative charge 38 in the portion 34 of the nitride layer 10 adjacent the drain 18 is "uncovered" because the region 56 of the negative charge 54 in the substrate 4 does not extend far from the edge of the drain region 18. When there is less than deep saturation of charge in the substrate region 56 adjacent the drain 18 during the erase-verify operation according to the present invention, the threshold voltage $V_T$ for allowing conduction between the source 16 and the drain 18 is a more sensitive function of the applied drain bias voltage $V_D$. Therefore, the presence of the residual charge 38 remaining in the portion 34 of the nitride layer 10 after a conventional erase operation can be detected with greater sensitivity.

In a manner similar to a conventional reading operation, the source 16 of the non-volatile cell is grounded during the erase-verify operation according to the present invention. The gate voltage $V_G$ applied to the gate 14 of the non-volatile memory cell 2 is typically a positive voltage. In an embodiment, the gate voltage applied to the gate of the non-volatile memory cell during the erase-verify operation according to the present invention is approximately equal to the gate voltage applied during a conventional reading operation.

Figure 5:
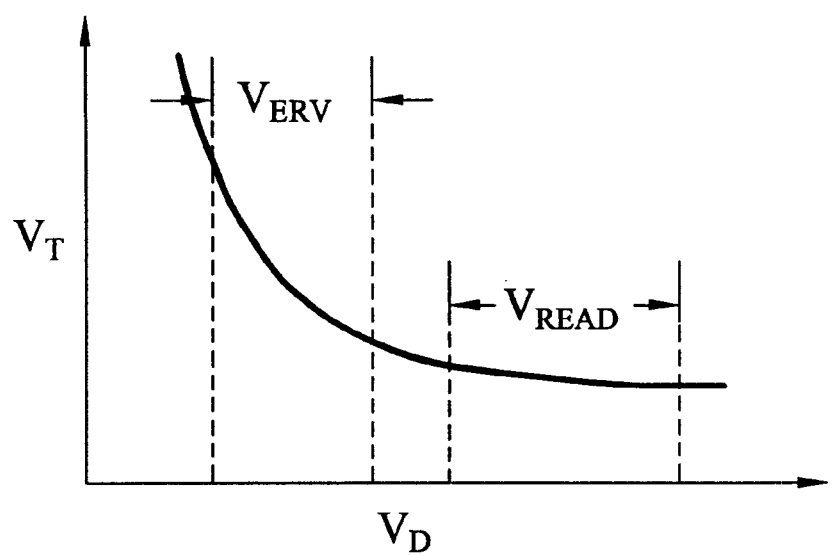
FIG. 5 shows a typical diagram of the threshold voltage $V_T$ versus the drain bias voltage $V_D$ illustrating different operating regions for the drain voltage $V_D$ in a typical reading operation and in the erase-verify operation according to the present invention.

FIG. 5 shows a typical curve of the threshold voltage $V_T$ versus the drain voltage $V_D$ for a given applied gate voltage $V_G$. A conventional reading operation is performed within a typical range $V_{READ}$ of high drain bias voltages. Within the high drain bias voltage range $V_{READ}$, the curve $V_T$ versus $V_D$ is relatively flat, signifying a deep saturation of charge in the substrate region 50 adjacent the drain 18 as shown in FIG. 2. As illustrated in FIG. 5, the threshold voltage $V_T$ varies only slightly with respect to the drain voltage $V_D$ within the high drain bias voltage range $V_{READ}$.

The drain voltage applied to the drain of the non-volatile memory cell during the erase-verify operation according to the present invention is lower than the high drain bias voltage applied during a conventional reading operation. As illustrated in FIG. 5, the erase-verify voltage range $V_{ERV}$ for the drain voltage $V_D$ is to the left of the high drain bias voltage range $V_{READ}$ for a conventional reading operation. Within the erase-verify voltage range $V_{ERV}$, the threshold voltage $V_T$ varies greatly and is thus more sensitive to the applied drain voltage $V_D$. The application of a low drain bias voltage $V_D$ within the erase-verify voltage range $V_{ERV}$ therefore allows the existence of the residual charge remaining in the nitride layer after a conventional incomplete erase operation to be sensed more effectively.

The actual gate and drain voltages applied to the non-volatile memory cell during the erase-verify operation according to the present invention may be selected according to various factors such as the doping concentrations and profiles of the drain and the source, the thicknesses of the nitride and oxide layers in the ONO film, and the availability of voltage levels generated by internal power supply pumps or external power supplies. For example, the gate voltage $V_G$ may have a typical range of about 3 V to about 5 V, and may be conveniently set to a voltage of about 3.3 V to allow the gate voltage $V_G$ to be supplied from a typical internal power supply pump for a typical non-volatile memory device.

In an embodiment in which the high drain bias voltage $V_D$ applied to the drain of the non-volatile memory cell is 1.6 V or above during a conventional reading operation, the low drain bias voltage according to the present invention may be in the range of 0.25 V to about 1.5 V. For example, the low drain bias voltage may be conveniently set to a voltage level of about 0.5 V. As in a conventional reading operation, the source of the non-volatile memory cell is grounded during the erase-verify operation according to the present invention.

Figure 6:
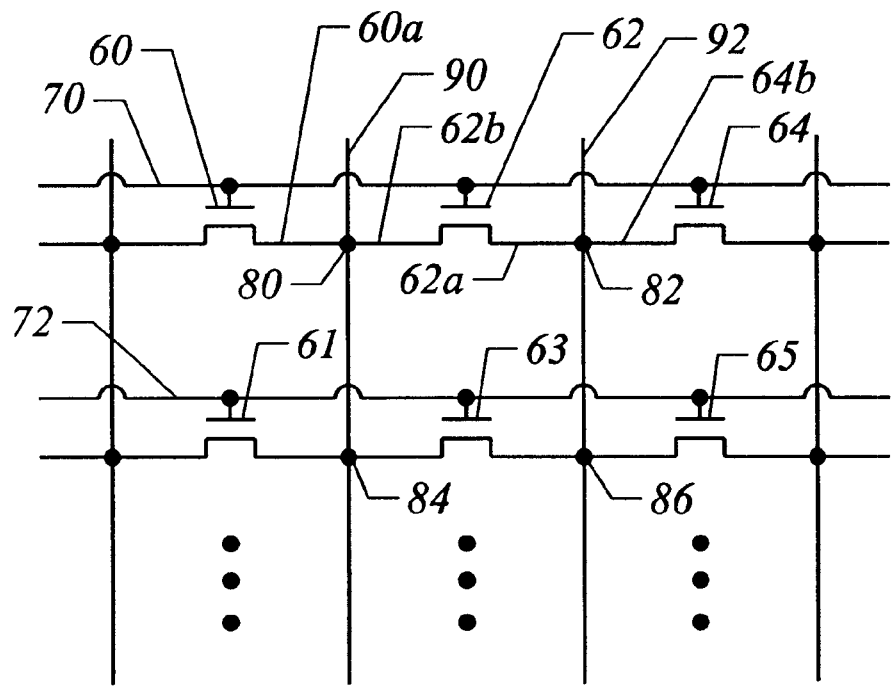
FIG. 6 is a circuit diagram showing an example of a non-volatile memory array comprising a plurality of non-volatile memory cells of FIG. 4 connected through a plurality of bit lines and word lines.

FIG. 6 shows a typical circuit diagram of an array of non-volatile memory cells arranged in a plurality of columns and rows. The gates of the memory cells in each row is connected to a respective word line. For example, the gates of the memory cells 60, 62, and 64 are connected to word line 70, whereas the gates of the memory cells 61, 63, and 65 are connected to word line 72.

Since the source and the drain of adjacent memory cells share the same physical arsenic-doped region as shown in the cross-sectional views of FIGS. 1–4, the source and the drain of adjacent memory cells are shown as being connected together in the circuit of FIG. 6. For example, the drain 60a of the memory cell 60 is connected to the source 62b of the memory cell 62 at a node 80, whereas the drain 62a of the memory cell 62 is connected to the source 64b of the memory cell 64 at another node 82. Similarly, the drains and the sources of adjacent memory cells 61, 63 and 65 are connected at nodes 84 and 86 as shown in FIG. 6.

The corresponding source-drain nodes in each column are connected to a respective bit line. For example, the source-drain nodes 80 and 84 are connected to bit line 90 while the source-drain nodes 82 and 86 are connected to bit line 92. The word lines and the bit lines shown in the circuit diagram of FIG. 6 may be provided in a conventional manner known to a person skilled in the art. For example, the bit lines may be provided as conventional buried bit lines connected to the arsenic-doped source-drain regions within the substrate.

The invention has been described with respect to particular embodiments thereof, and numerous modifications can be made which are within the scope of the invention as set forth in the claims.

what is claimed is:

1. A method of performing an erase-verify operation after an erase operation on a non-volatile memory cell which comprises a drain and a source in a substrate with a surface between the drain and the source, a nitride layer above the surface of the substrate, and a gate above the nitride layer, an amount of residual charge remaining in at least a portion of the nitride layer after the erase operation, the non-volatile memory cell being applied a gate voltage and a high drain voltage during a read operation, the method of performing the erase-verify operation comprising the steps of:
   applying a gate voltage to the gate of the non-volatile memory cell; and
   applying a low drain voltage less than e high drain voltage to the drain of the non-volatile memory cell.

2. The method of claim 1, wherein the low drain voltage is in the range of about 0.25 V to about 1.5 V.

3. The method of claim 2, wherein the low drain voltage is about 0.5 V.

4. The method of claim 1, wherein the step of applying a gate voltage further includes applying a gate voltage for the erase-verify operation approximately equal to the gate voltage applied to the non-volatile memory cell during the read operation.

5. The method of claim 4, wherein the gate voltage is in the range of about 2 V to about 5 V.

6. The method of claim 5, wherein the gate voltage is about 3.3 V.

7. The method of claim 1, further comprising the step of grounding the source of the non-volatile memory cell.

8. The method of claim 1, wherein the portion of the nitride layer in which the residual charge remains after the erase operation is adjacent the drain.

9. The method of claim 8, wherein the low drain voltage applied to the drain during the erase-verify operation causes less than deep saturation of charge in a portion of the substrate adjacent the drain and beneath the portion of the nitride layer wherein the residual charge accumulated during the erase operation, to uncover the residual charge remaining in the portion of the nitride layer to verify that the memory cell was erased.

10. The method of claim 9, wherein the residual charge remaining in the portion of the nitride layer after the erase operation comprises negative charge.

11. The method of claim 1, wherein the nonvolatile memory cell further comprises a first oxide layer between the nitride layer and the surface of the substrate.

12. The method of claim 11, wherein the nonvolatile memory cell further comprises a second oxide layer between the nitride layer and the gate.

13. The method of claim 1, wherein the gate comprises a polysilicon layer.

14. The method of claim 1, wherein the source and the drain comprise arsenic doped regions.

15. A method of performing an erase-verify operation after an erase operation on a non-volatile memory cell which comprises a drain and a source in a substrate having a surface between the drain and the source, a nitride layer above the surface of the substrate, and a gate above the nitride layer, an amount of residual charge remaining in at least a portion of the nitride layer after the erase operation, the method of performing the erase-verify operation comprising the step of:
   (a) applying a gate voltage in the range of about 2 V to about 5 V to the gate of the non-volatile memory cell; and
   (b) applying a low drain voltage in the range of about 0.25 V to about 1.5 V to the drain of the non-volatile memory cell.

16. The method of claim 15, further comprising the step of grounding the source of the non-volatile memory cell.

17. The method of claim 15, wherein the gate voltage is about 3.3 V.

18. The method of claim 15, wherein the low drain voltage is about 0.5 V.

19. The method of claim 15, wherein the portion of the nitride layer in which the residual charge remains after the erase operation is adjacent the drain.

20. The method of claim 19, wherein the low drain voltage applied to the drain during the erase-verify operation causes less than deep saturation of charge in a portion of the substrate adjacent the drain and beneath the portion of the nitride layer wherein the residual charge accumulated during the erase operation, to uncover the residual charge remaining in the portion of the nitride layer to verify that the memory cell was erased.

21. The method of claim 20, wherein the residual charge remaining in the portion of the nitride layer after the erase operation comprises negative charge.

22. The method of claim 15, wherein the nonvolatile memory cell further comprises a first oxide layer between the nitride layer and the surface of the substrate.

23. The method of claim 22, wherein the nonvolatile memory cell further comprises a second oxide layer between the nitride layer and the gate.

24. The method of claim 15, wherein the gate comprises a polysilicon layer.

25. The method of claim 15, wherein the source and the drain comprise arsenic doped regions.

26. A method of performing an erase-verify operation after an erase operation on a non-volatile memory cell which comprises a drain and a source in a substrate having a surface between the drain and the source, a first oxide layer on the surface of the substrate, a nitride layer on the first oxide layer, a second oxide layer on the nitride layer, and a gate on the second oxide layer, an amount of residual negative charge remaining in a portion of the nitride layer adjacent the drain after the erase operation, the method of performing the erase-verify operation comprising the step of:

(a) applying a gate voltage in the range of about 2 V to about 5 V to the gate of the non-volatile memory cell; and (b) applying a low drain voltage in the range of about 0.25 V to about 1.5 V to the drain of the non-volatile memory cell; and (c) grounding the source of the non-volatile memory cell.

27. The method of claim 26, wherein the gate voltage is about 3.3 V.

28. The method of claim 26, wherein the low drain voltage is about 0.5 V.

29. The method of claim 26, wherein the low drain voltage applied to the drain during the erase-verify operation causes less than deep saturation of charge in a portion of the substrate adjacent the drain and beneath the portion of the nitride layer wherein the residual charge accumulated during the erase operation, to uncover the residual charge remaining in the portion of the nitride layer to verify that the memory cell was erased.

30. The method of claim 26, wherein the gate comprises a polysilicon layer.

31. The method of claim 26, wherein the source and the drain comprise arsenic doped regions.

* * * * *

UNITED STATES PATENT AND TRADEMARK OFFICE
CERTIFICATE OF CORRECTION

PATENT NO.     : 6,501,681 B1
DATED          : December 31, 2002
INVENTOR(S)    : Micha4el Van Buskirk and Narbeh Derhacobian It is certified that error appears in the above-identified patent and that said Letters Patent is hereby corrected as shown below:

<u>Column 10,</u>
Line 6, change "e" to -- the --.
Lines 39 and 42, change "nonvolatile" to -- non-volatile --.

Signed and Sealed this

Twenty-fifth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,501,681 B1
DATED : December 31, 2002
INVENTOR(S) : Michael Van Buskirk and Narbeh Derhacobian It is certified that error appears in the above-identified patent and that said Letters Patent is hereby corrected as shown below:

<u>Column 10,</u>
Line 6, change "e" to -- the --.
Lines 39 and 42, change "nonvolatile" to -- non-volatile --.

This certificate supersedes Certificate of Correction issued March 25, 2003.

Signed and Sealed this

Eighth Day of July, 2003

JAMES E. ROGAN
*Director of the United States Patent and Trademark Office*